(12) United States Patent
Okamoto

(10) Patent No.: US 8,136,064 B2
(45) Date of Patent: Mar. 13, 2012

(54) BIJECTIVELY MAPPING CHARACTER STRING TO INTEGER VALUES IN INTEGRATED CIRCUIT DESIGN DATA

(75) Inventor: Shinichiro Okamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 313 days.

(21) Appl. No.: 12/512,154

(22) Filed: Jul. 30, 2009

(65) Prior Publication Data

US 2010/0031210 A1 Feb. 4, 2010

(30) Foreign Application Priority Data

Jul. 31, 2008 (JP) ................................. 2008-197565

(51) Int. Cl.
*G06F 17/50* (2006.01)
(52) U.S. Cl. ........ 716/105; 716/101; 716/102; 716/103; 716/104; 703/14
(58) Field of Classification Search .......... 716/101–105; 703/14
See application file for complete search history.

(56) References Cited

U.S. PATENT DOCUMENTS

| | | | | |
|---|---|---|---|---|
| 5,111,413 A | * | 5/1992 | Lazansky et al. | 703/14 |
| 5,164,908 A | * | 11/1992 | Igarashi | 716/124 |
| 5,473,546 A | * | 12/1995 | Filseth | 716/103 |
| 5,901,064 A | * | 5/1999 | Weber et al. | 716/103 |
| 6,314,194 B1 | * | 11/2001 | Michael et al. | 382/113 |
| 6,591,402 B1 | * | 7/2003 | Chandra et al. | 716/106 |
| 6,691,132 B2 | * | 2/2004 | Walker et al. | 1/1 |
| 7,380,226 B1 | * | 5/2008 | Goldberg | 716/105 |
| 7,444,347 B1 | * | 10/2008 | Alley et al. | 1/1 |
| 7,805,697 B2 | * | 9/2010 | Wood | 716/113 |
| 2003/0093253 A1 | * | 5/2003 | Freyensee et al. | 703/13 |
| 2006/0190910 A1 | * | 8/2006 | Roesner et al. | 716/18 |
| 2007/0198557 A1 | * | 8/2007 | Ching et al. | 707/101 |
| 2008/0005713 A1 | * | 1/2008 | Singh et al. | 716/11 |
| 2008/0263486 A1 | * | 10/2008 | Alexanian et al. | 716/5 |
| 2009/0031277 A1 | * | 1/2009 | McElvain et al. | 716/18 |

FOREIGN PATENT DOCUMENTS

JP 2003-167937 A 6/2003

* cited by examiner

*Primary Examiner* — Naum Levin
(74) *Attorney, Agent, or Firm* — Wolf, Greenfield & Sacks, P.C.

(57) ABSTRACT

A data processor which includes: a circuit data providing section which provides circuit data including a character string; a replacement section which bijectively maps the character string of the provided circuit data to integer values; and a data developer which executes data processing including hierarchical development with respect to the circuit data of the integer values obtained by the replacement section.

10 Claims, 17 Drawing Sheets

FIG. 4

CHARACTER STRING IN CIRCUIT DATA (EXAMPLE): mult_23_DP_OP_245_9818_ff0_out_reg_17_ASThfnInst2216
VALUE OBTAINED BY MAPPING CHARACTER STRING TO INTEGERS (EXAMPLE): 0x27bba7a0

FIG. 8

| NUMBER OF GATES | AA | BA | AA/BA |
|---|---|---|---|
| 8 MILLION | 947 [s] | 36 [s] | 26.30 |
| 20 MILLION | 2,489 [s] | 76 [s] | 32.75 |

MOST SIGNIFICANT NET: A

MOST SIGNIFICANT NET: F

MOST SIGNIFICANT NET: B

```
module top (NET NAME 1, NET NAME 2);
input NET NAME 1;
output NET NAME 2;

BUF inst (.A (NET NAME 1), .X (NET NAME 2) );
endmodule
```

BIJECTIVELY MAPPING CHARACTER STRING TO INTEGER VALUES IN INTEGRATED CIRCUIT DESIGN DATA

BACKGROUND OF THE INVENTION

1. Field of the Invention

The present invention relates to an apparatus, a method and a program for processing data including design data of a semiconductor integrated circuit.

2. Description of the Related Art

Commercially available tools for designing a semiconductor integrated circuit may include electronic design automation (EDA) tools.

As shown in FIG. 1, an EDA tool analyzes syntax of a net list of circuit data and establishes net connection information from the net list.

A method for improving circuit simulation accuracy through reproduction of characteristics of specific devices of a circuit device has been proposed (for example, see Japanese Unexamined Patent Application Publication (JP-A) No. 2003-167937).

SUMMARY OF THE INVENTION

As semiconductor integrated circuits have recently increased in size, processing time and memory requirement for hierarchical development of commercially available EDAs have been increasing.

The number of gates increases as the semiconductor integrated circuits increase in size and net list processing time thus increases exponentially as shown in FIG. 2.

In particular, as shown in FIG. 1, establishment of net connection information from the net list involves comparison of character string (i.e., net names), which exponentially increasing the processing time.

Hierarchical development has been employed in internal processing of various commercially available EDA tools. Improvement in processing speed of hierarchical development and decrease in memory requirement are important for reduction in design time.

In the method disclosed in JP-A-2003-167937, a character string is mapped (i.e., transformed) to corresponding area values.

The area values may disadvantageously not be remapped (i.e., inverse-transformed) to the character string.

The area values may not function as identifiers and thus may not be used for data processing in, for example, a database.

It is desirable to provide an apparatus, method and program for processing data with reduced processing time even for large-sized circuit structure and with processed data being applicable to data for, for example, a database.

A data processor according to a first embodiment of the invention includes: a circuit data providing section which provides circuit data including a character string; a replacement section which bijectively maps the character string of the provided circuit data to integer values; and a data developer which executes data processing including hierarchical development with respect to the circuit data of the integer values obtained by the replacement section.

The replacement section may preferably divide the character string of a hierarchical net name into a hierarchical name and a net name and process these names on the basis of a hash function to separately generate a hierarchical class start address and a net class start address; and may preferably add the generated addresses to provide a hash value and process the hash value on the basis of the hash function to obtain the integer values.

The replacement section may preferably include a storage section which stores correspondence between the original character string and the integer values mapped from the character string in the circuit data.

The data developer includes a hierarchy developer which creates the circuit data by developing a hierarchy of a net list, the hierarchy being removed from the circuit data that keeps the hierarchy; and the hierarchy developer includes a grouping section which groups nets connected directly together across hierarchical levels, and a net search section which develops a hierarchy of the circuit data by searching for the most significant net in the group.

The grouping section may preferably create a tree structure for grouping the nets.

The net search section may preferably follow the tree structure toward a higher level to obtain the most significant net.

If a plurality of nets exists in a hierarchy level, the net search section may preferably determine the most significant net according to a predetermined order.

The net search section may preferably develop the hierarchy by connecting all the circuit device data in a list structure and replacing nets connected to terminals of the device data connected in a list structure by the most significant net.

A method of processing data method according to a second embodiment of the invention includes: a first step for providing circuit data including a character string in a providing section; a second step in which, in a replacement section, the character string of the provided circuit data is bijectively mapped to integer values; and a third step in which, in a data developer, circuit data of integer values generated in the second step is processed, the processing including developing a hierarchy.

A third embodiment of the invention is a program which causes a computer to execute data processing, the data processing including: a first step for providing circuit data including a character string in a providing section; a second step in which, in a replacement section, the character string of the provided circuit data is bijectively mapped to integer values; and a third step in which, in a data developer, circuit data of integer values generated in the second step is processed, the processing including developing a hierarchy.

According to the invention, the character string (i.e., the identifier) is bijectively mapped to the integer values.

The integer values may therefore be inversely mapped to the character string (i.e., identifiers). The mapped integer values may function as identifiers and thus may be used in data processing in, for example, a database.

According to the invention, data may be processed in reduced time even for large-sized circuit structures and processed data may be applied to data for, for example, a database.

BRIEF DESCRIPTION OF THE DRAWINGS

FIG. 4 shows exemplary bijective mapping of a character string (i.e., identifier) in circuit data to integers;

FIG. 8 illustrates comparison in processing time necessary for construction of directed graph data after hierarchical development in an existing algorithm and an algorithm of the present embodiment;

DESCRIPTION OF THE PREFERRED EMBODIMENTS

Figure 1:
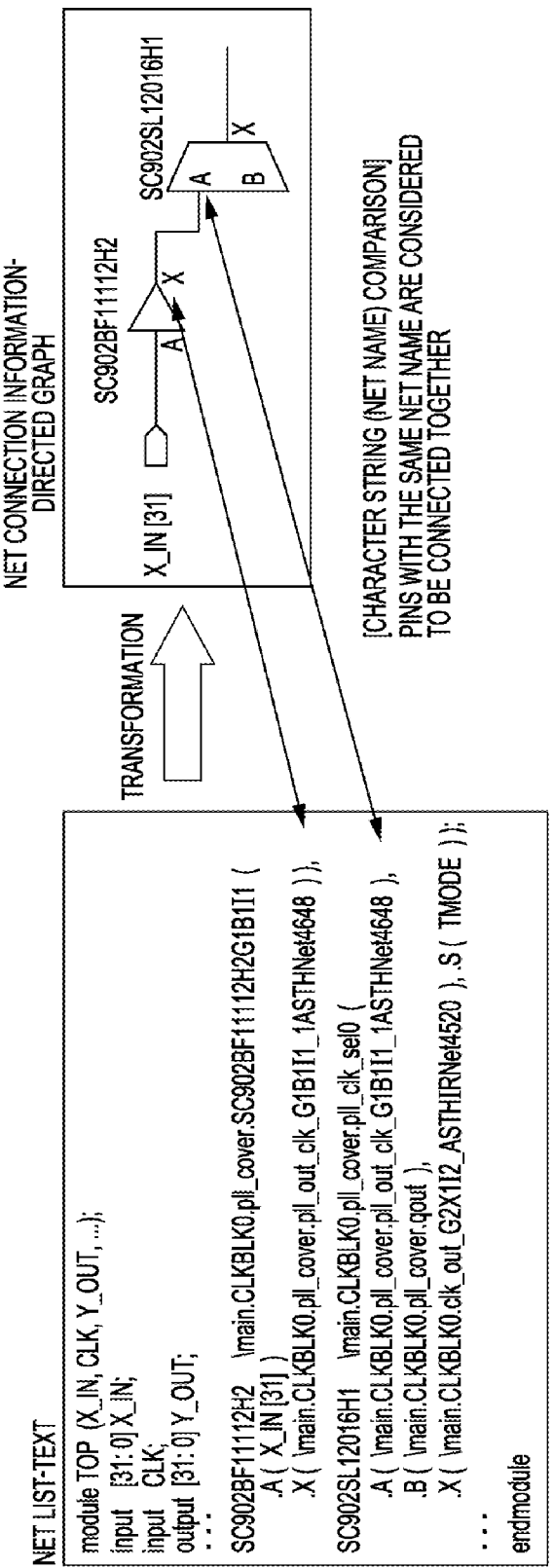
FIG. 1 illustrates a function for analyzing syntax of a net list of circuit data in an EDA tool and establishing net connection information from the net list.
Figure 2:
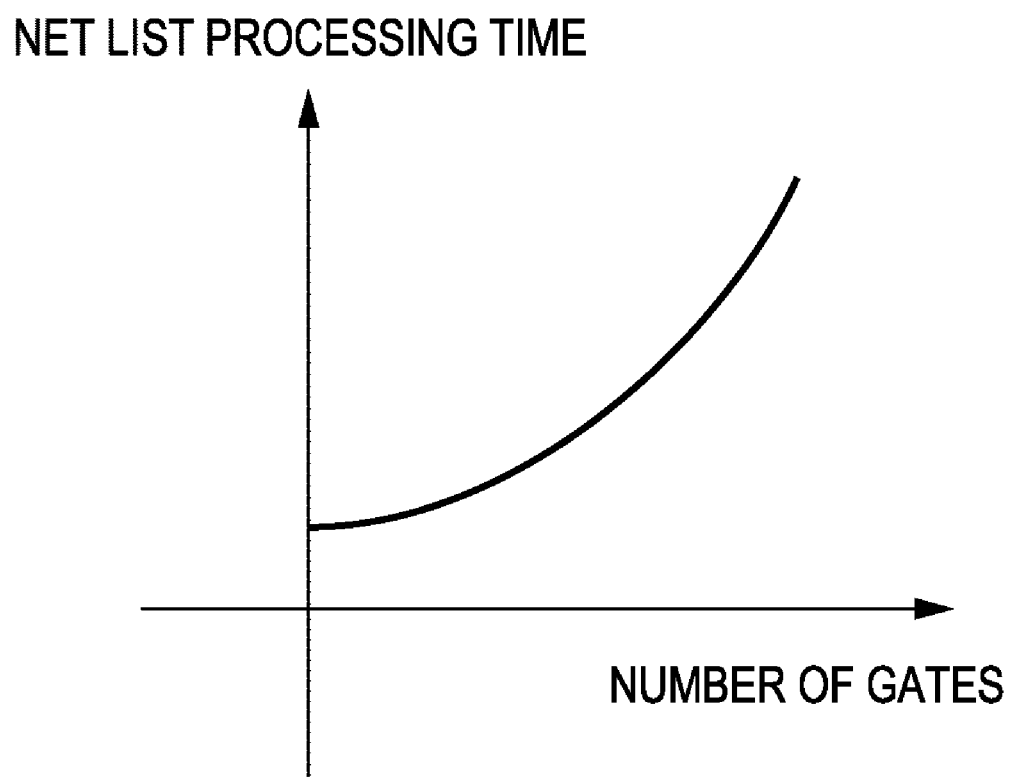
FIG. 2 demonstrates that the number of gates increases as a semiconductor integrated circuit increases in size, thereby exponentially increasing the net list processing time.

Referring now to the drawings, an embodiment of the invention will be described.

Figure 3:
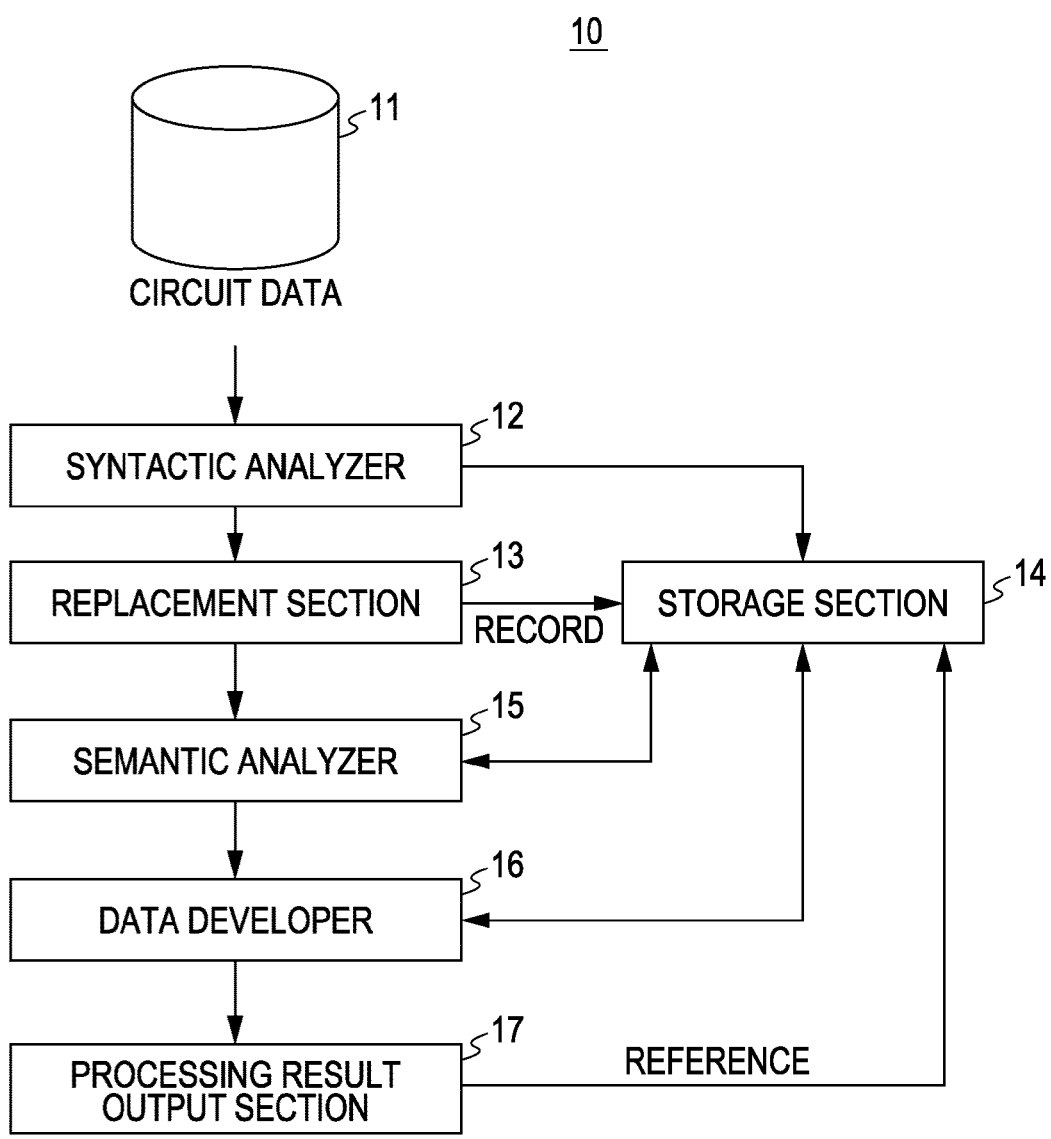
FIG. 3 is a block diagram showing an exemplary configuration of a data processor according to an embodiment of the invention.

FIG. 3 is a block diagram showing an exemplary configuration of a data processor according to an embodiment of the invention.

A data processor 10 includes a circuit data providing section 11, a syntactic analyzer 12, a replacement section 13, a storage section 14, a semantic analyzer 15, a data developer 16 and a processing result output section 17 as shown in FIG. 3.

The circuit data providing section 11 provides the syntactic analyzer 12 with circuit data.

The circuit data may be read from a database or input from an input section, such as a keyboard.

The syntactic analyzer 12 of the circuit data analyzes syntax of a cell library and of the net list which is the circuit data provided from the circuit data providing section 11, and stores data including identifiers in the storage section 14.

The term "identifier" herein refers to a character string, such as an instance name and a net name.

The replacement section 13 maps the identifier (i.e., the character string) stored in the storage section 14 at the syntactic analyzer 12 to integer values and replaces the character string with the integer values.

FIG. 4 shows exemplary bijective mapping of a character string (i.e., identifier) in the circuit data to integers.

The storage section 14 records correspondence between the character string in the circuit data which has been subject to syntax analysis in the syntactic analyzer 12 and the integer value mapped in the replacement section 13.

That is, the storage section 14 records correspondence between the original character string and the integer values mapped in the replacement section 13, which maps the character string in the circuit data to the integer values.

The semantic analyzer 15 of the circuit data executes semantic analysis to the circuit data in which the character string has been replaced by the integer values in the replacement section 13.

The data developer 16 executes data processing, such as hierarchical development, to the circuit data for which the semantic analysis has been executed by the semantic analyzer 15.

The processing result output section 17 outputs a processing result of the data developer 16.

The basic configuration of the data processor 10 according to the present embodiment has been described in the foregoing description.

Next, processing in the data processor 10 of the present embodiment will be described. Such processing may include hierarchical development and mapping of an identifier (i.e., a character string) to integer values to replace the character string with the integer values.

The data processor 10 of the present embodiment basically maps the character string (i.e., a net name) to 64-bit integers and determines net connection not using the character string but using the 64-bit integers.

Figure 5:
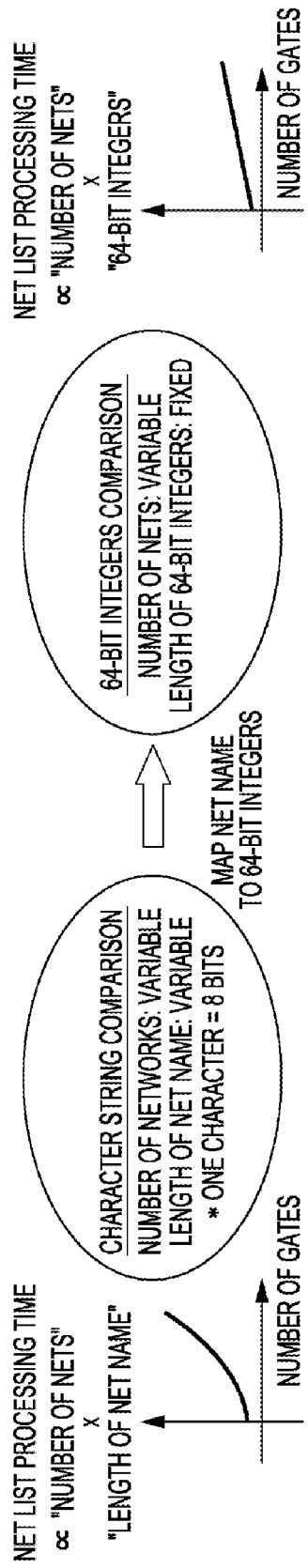
FIG. 5 illustrates that the processing time linearly increases as the number of gates increases in the present embodiment.

Thus, the processing time increases linearly as the number of gates increases as shown in FIG. 5.

FIG. 5 shows an example in which the net list processing time increases exponentially as the number of gates increases in a Comparative Example.

In the mapping, the character strings which are the same may take the same integer values and different character strings may take different integer values.

Figure 6:
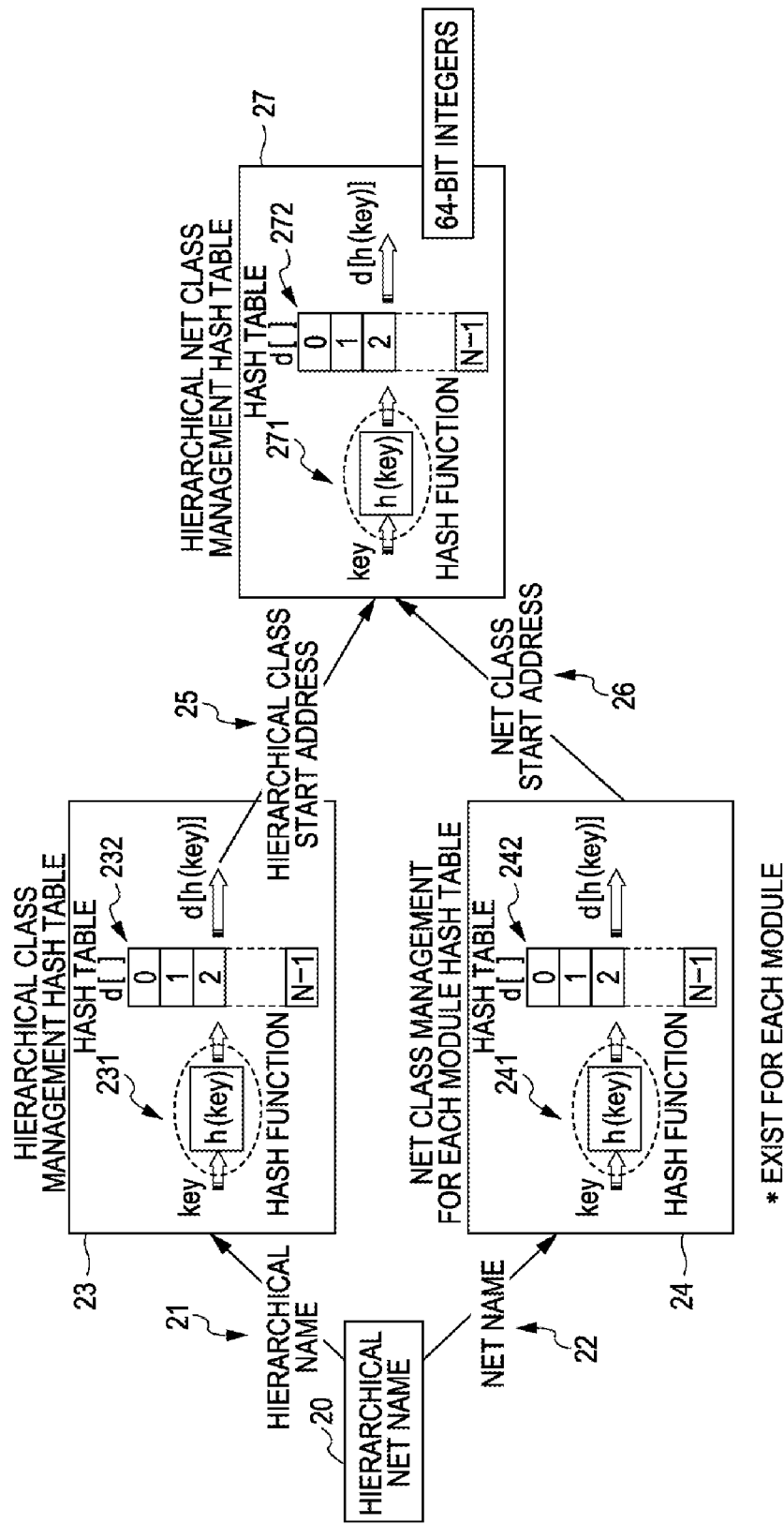
FIG. 6 schematically illustrates a method for high-speed mapping of the character string to 64-bit integers according to the present embodiment.

FIG. 6 schematically illustrates a method for high-speed mapping of the character string to 64-bit integers according to the present embodiment.

As shown in FIG. 6, the data processor 10 of the present embodiment processes the character string of a hierarchical net name 20 in terms of a hierarchical name 21 and a net name 22.

The hierarchical name 21 is given to a hierarchical class management section 23 and the net name 22 is given to a net class management section 24 for each module.

The hierarchical class management section 23 makes a high-speed comparison (i.e., retrieval) for the hierarchical name 21 given in a hash function processing section 231 based on a predetermined key and generates a hierarchical class start address 25 using a hash table 232.

The data for high-speed comparison (i.e., retrieval) of the character string is managed by the hash table 232.

The net class management section 24 makes a high-speed comparison (i.e., retrieval) for the net name 22 given in a hash function processing section 241 based on a predetermined key and generates a net class start address 26 using a hash table 242.

The data for high-speed comparison (i.e., retrieval) of the character string is managed by the hash table 242.

The hierarchical class start address 25 and the net class start address 26 are provided to the hierarchical net class management section 27.

The hierarchical net class management section 27 adds the hierarchical class start address 25 provided by the hash function processing section 271 to the net class start address 26 to generate a hash value.

The hash value obtained by addition of the addresses may reduce processing time and may help efficiently avoid collisions.

The hierarchical net class management section 27 executes processes on the basis of the predetermined key in the hash function processing section 271 and then generates, using the hash table 272, 64-bit integers which are not a character string.

Figure 7:
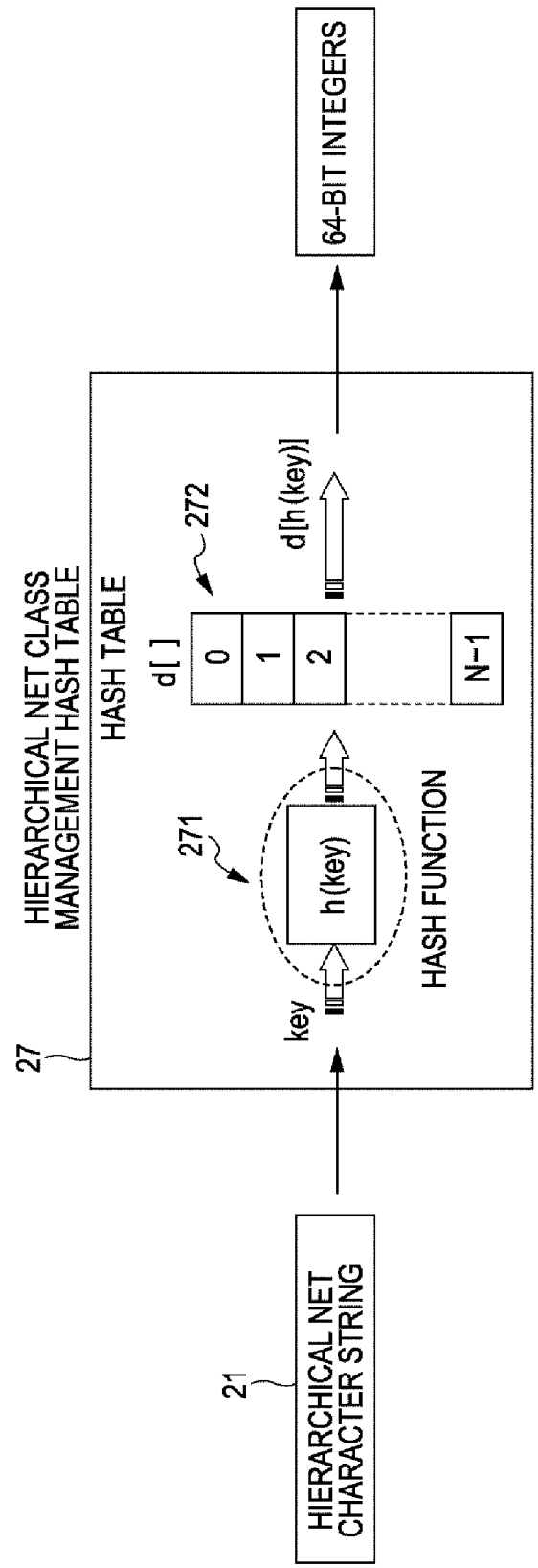
FIG. 7 is schematically illustrates another method for high-speed mapping of the character string to 64-bit integers according to the present embodiment.

FIG. 7 schematically illustrates another method of mapping a character string to 64-bit integers at high speed according to the present embodiment.

As shown in FIG. 7, the hierarchical net character string 21 may also be provided directly to the hierarchical net class management section 27 to generate 64-bit integers without dividing the hierarchical net character string 21 into the hierarchical name 21 and the net name 22 in order to achieve high-speed mapping of the character string to the 64-bit integers.

In this case, however, a longer time may be necessary for computation of the hash value in the case of a longer character string.

A large amount of data may increase the occurrence of collisions. The time taken comparing character string may also be increased.

That is, a longer processing time may be necessary for handling of the hierarchical net name 21 as is, compared with the case of FIG. 6.

It is therefore preferred to employ the method shown in FIG. 6 for high speed processing.

Now, an exemplary high-speed hash function which is applicable to the present embodiment will be described.

Definition of Hash Function $$h(s, v) = \\ \text{set } h0 \leftarrow \text{init}(v) \\ \text{for each character } c_i \text{ in } s, \\ \quad \text{set } h_i \leftarrow \text{step}(i \text{ and } h_{i-1}, c_i) \\ \text{return } h = \text{final}(h_m, v)$$

Wherein $h(s, v)$ represents a hash value obtained by inputting the character string and a seed value; v represents the seed value; s represents the input character string; $c_i$ represents the i-th character of the string; $h_i$ represents the hash value computed until I is reached; and m represents the string length.

Definition of Sub Function $$\text{init}(v) = 0 \\ \text{step}(i, h, c) = P_i \times h + c \\ \text{final}(h, v) = (h||p)||T$$

Wherein v represents a seed value; h represents a hash value; c represents a character; $P_i$ represents a prime number, e.g., 65,587; p represents a prime number, e.g., 3,001; and T represents a table size.

The hash function is provided in order to, for example, process a Verilog character string at high speed. Such a hash function is provided for the following reason.

The Verilog character string differs from ordinary text with many character strings (e.g., NET 1) of the same alphabet and different numerals.

Thus, desirable characteristics may not be obtained by an ordinary hash function provided from a C++ library.

In order to obtain desirable characteristics, the hash function has to satisfy the following requirements.

1) Close hash values are not generated from similar data.

2) Certain data and other data with the same hash value (i.e., collision of hash values) may not be easily generated.

3) There is no deviation in the hash value.

A hash function having desirable characteristics with respect to the Verilog character string described above is provided to satisfy these requirements.

FIG. 8 illustrates a comparison of processing times necessary for construction of directed graph data after hierarchical development for an existing algorithm and an algorithm of the present embodiment.

In FIG. 8, AA represents the existing algorithm and BA represents the algorithm of the present embodiment.

The example of FIG. 8 shows the processing time for 8 million gates and 20 million gates.

As shown in FIG. 8, the present algorithm B may be over 25 times faster than the existing algorithm A.

Next, a process for creating circuit data hierarchically developed from the circuit data keeping the hierarchy will be described.

The process for hierarchical development of the circuit data of the present embodiment includes grouping nets connected directly together across hierarchical levels and searching for the most significant hierarchy in the group.

Figure 9:
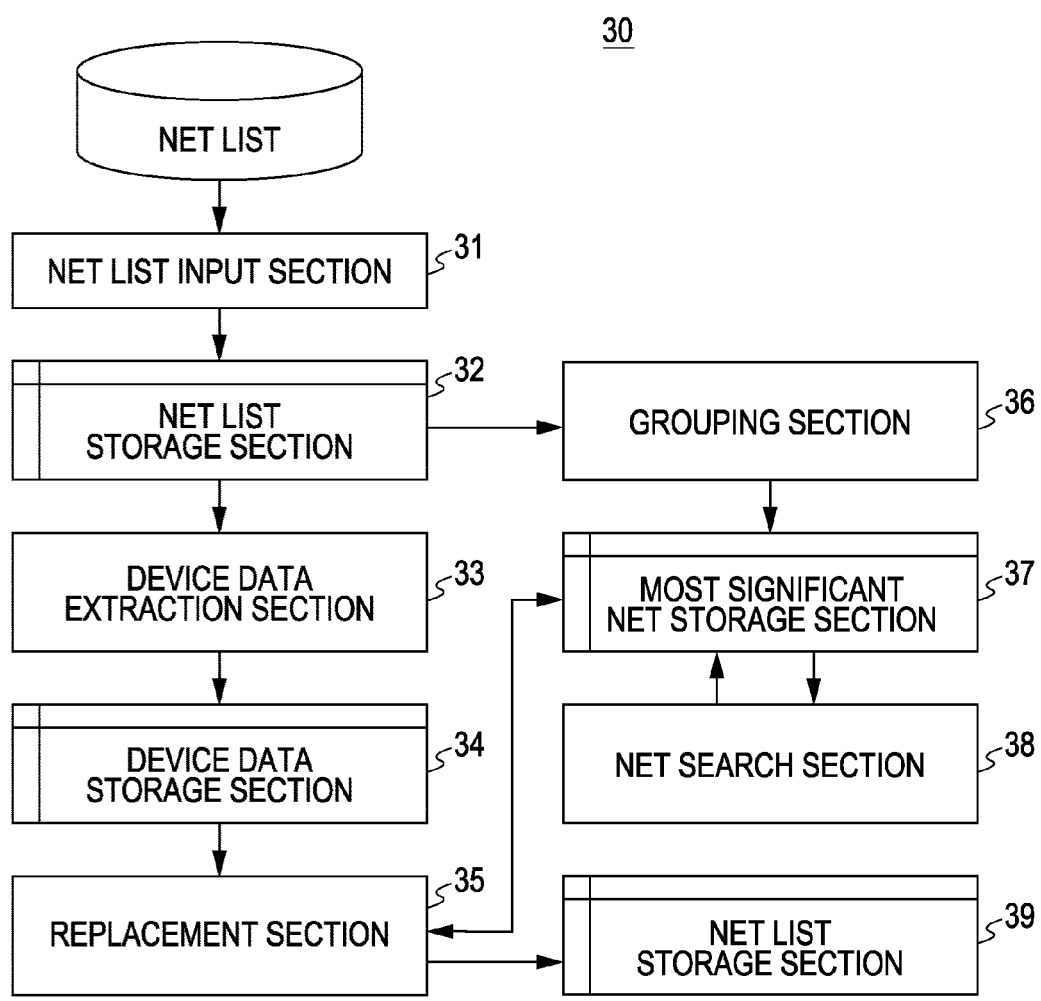
FIG. 9 is a functional block diagram of hierarchical development of a net list according to the present embodiment.

FIG. 9 is a functional block diagram of hierarchical development of the net list according to the present embodiment.

The hierarchy developer 30 of the net list includes a net list input section 31, a net list storage section 32, a device data extraction section 33, a device data storage section 34, a replacement section 35, a grouping section 36, a most significant net storage section 37, a net search section 38 and a net list storage section 39.

The device data extraction section 33 extracts only device (leaf cell) data from a net list stored in the net list storage section 32.

The device data extraction section 33 stores extracted device data to this device data storage section 34.

The device data storage section 34 stores all the device data.

The replacement section 35 replaces a net connected to the device by the most significant net.

The grouping section 36 groups the net (wire) connected directly when the hierarchy is removed.

The most significant net storage section 37 stores the net group formed by the grouping section 36 and the most significant net of that net group.

The net search section 38 searches for the most significant net from the net group stored in the most significant net storage section 37 and stores the search result in the most significant net storage section 37.

The net list storage section 39 stores the net list after hierarchical development.

The net list storage section 39 may also be formed as the same storage section as the device data storage section 34.

Next, exemplary hierarchical development of the net list according to the present embodiment will be described.

Figure 10:
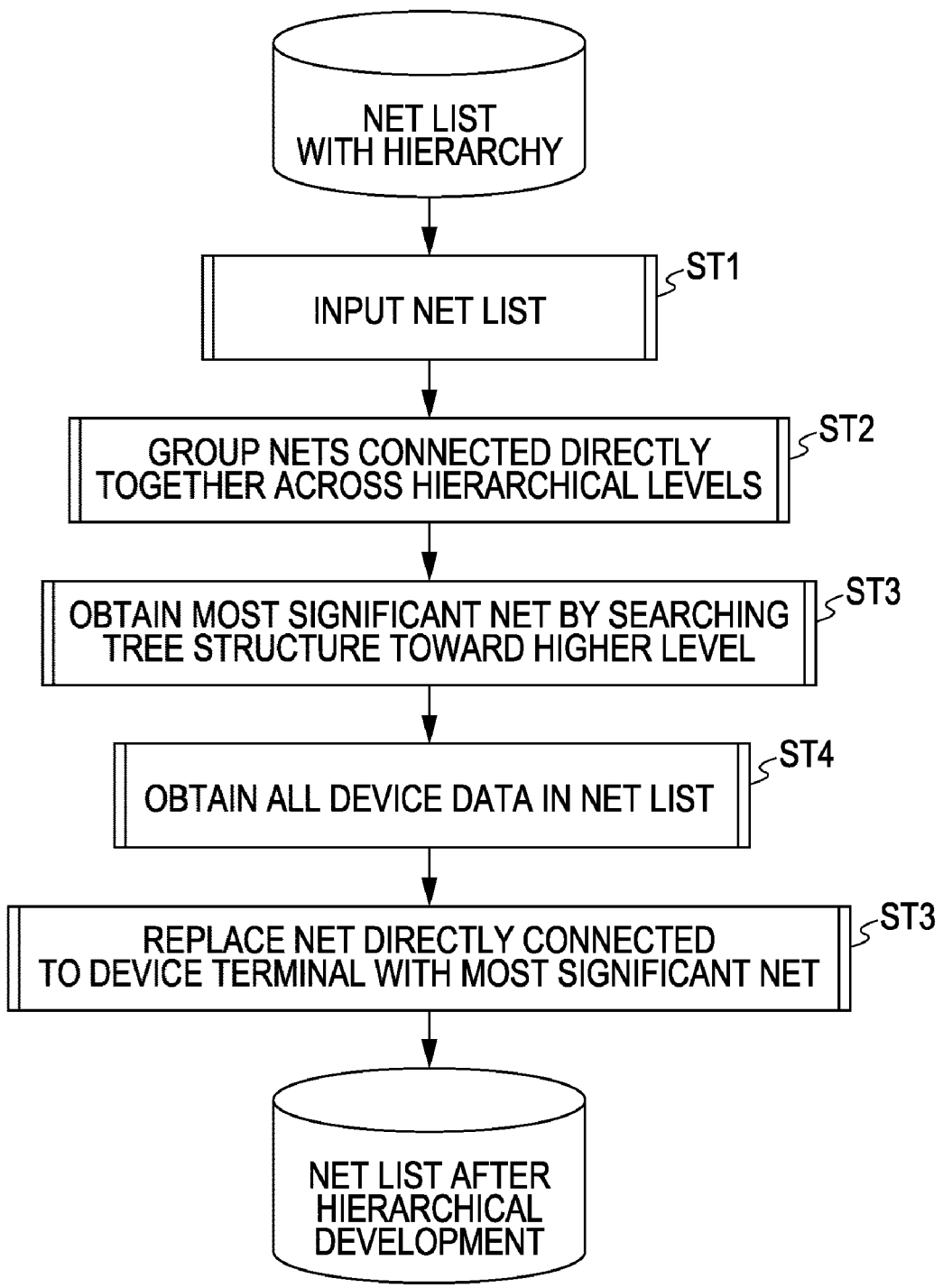
FIG. 10 is a flowchart illustrating the hierarchical development of the net list according to the present embodiment.

FIG. 10 is a flowchart illustrating hierarchical development of the net list according to the present embodiment.

FIGS. 11 to 16 illustrate hierarchical development of the net list according to the present embodiment.

In FIGS. 11 to 16, A, B, C, D, E and F represent the net (wire) names.

In step ST1, the net list input section 31 inputs the net list keeping a hierarchy and stores the net list in the net list storage section 32.

In step ST2, the grouping section 36 groups the net connected directly when the hierarchy is removed.

Figure 11:
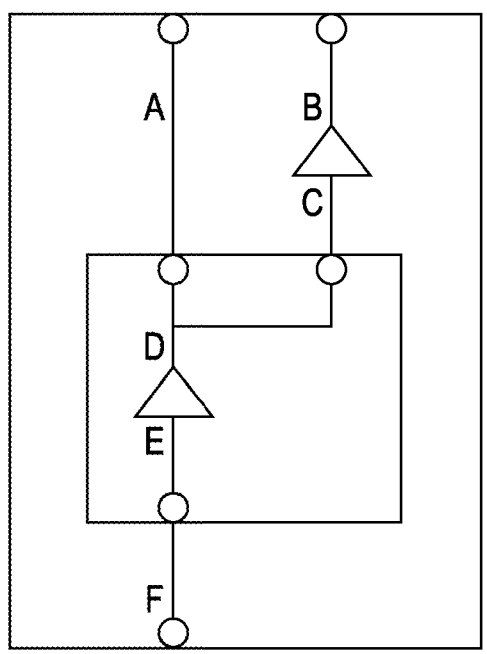
FIG. 11 is a first view illustrating the hierarchical development of the net list according to the present embodiment.
Figure 14:
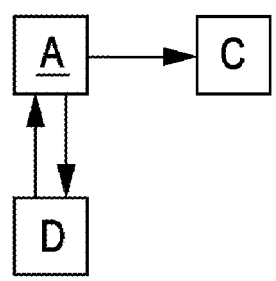
FIG. 14 is a fourth view illustrating the hierarchical development of the net list according to the present embodiment.
Figure 15:
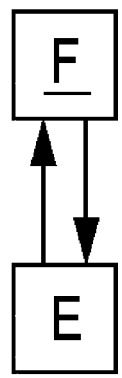
FIG. 15 is a fifth view illustrating the hierarchical development of the net list according to the present embodiment.
Figure 16:
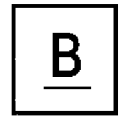
FIG. 16 is a sixth view illustrating the hierarchical development of the net list according to the present embodiment.

Exemplary net groups are shown in FIGS. 14 to 16 based on FIG. 11.

Grouping herein means to form and represents a tree data structure as shown in FIGS. 14 to 16.

In particular, since a net A is connected to a net D at a higher hierarchy level in FIG. 14, a tree structure is formed such that the net A is a parent node of the net D and therefore the net D is a child node of the net A as shown in FIG. 14.

Although the net C is located in the same hierarchy level as that of the net A, the net C may be a brother node when multiple nets are in the same hierarchy.

In step ST3, the net search section 38 searches for the tree data structure at a higher level to obtain the most significant net in the group.

Then, as shown in FIGS. 14 to 16, information on the most significant net is given to each node.

The most significant nets in the group of FIG. 14 are the net A and the net C.

If there are a plurality of most significant nets like the net A and the net C, the net directly connected to an external port like the net A of FIG. 11 is determined to be the most significant net in the group.

If a plurality of nets are under the same condition, the most significant net is determined from alphabetical order.

In addition to determining the most significant net in accordance with alphabetical order, it may also be determined in a different manner, as long as one net is uniquely determined.

Figure 12:
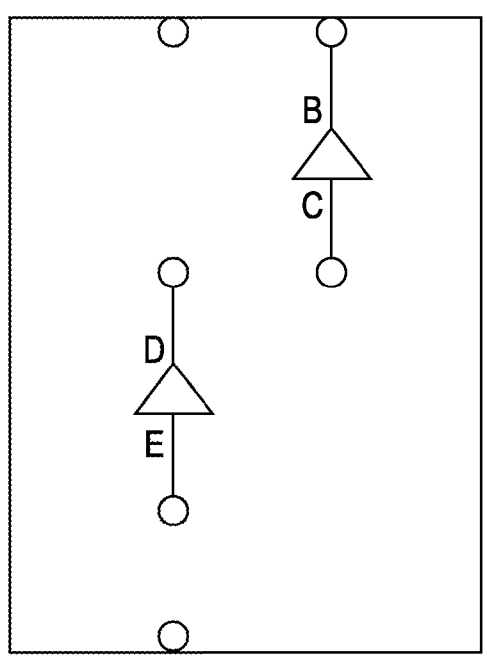
FIG. 12 is a second view illustrating the hierarchical development of the net list according to the present embodiment.

In step ST4, the device data extraction section 33 extracts all the device data existing in the net list as shown in FIG. 12.

Then the extracted device data is stored in the device data storage section 34 as shown in FIG. 12.

In particular, the device and the nets connected thereto are stored as they are in the device data storage section 34.

The device data extraction section 33 extracts all the device data existing in the net list. All the device data (i.e., the lowest module that may not be hierarchically developed any more) are connected in a list structure.

The device data includes information on the device terminal and the net linked to the terminal.

In step ST5, the replacement section 35 replaces the net directly connected to the device terminal with the most significant net using the information on the grouped nets.

The net A will be obtained if the most significant net of the net D of FIG. 12 is searched for with reference to the net group of FIG. 14. Then, the net D is replaced by the net A.

Similarly, since the most significant net of the net C is the net A, the net C is replaced by the net A.

In this manner, the same process is executed on the net connected to all the devices. The result is shown in FIG. 13.

The net directly connected to the device terminal is replaced by the most significant net.

The hierarchical development may be provided by replacing, with the most significant net, the net connected to the terminals of all the device data connected in the list structure.

Figure 13:
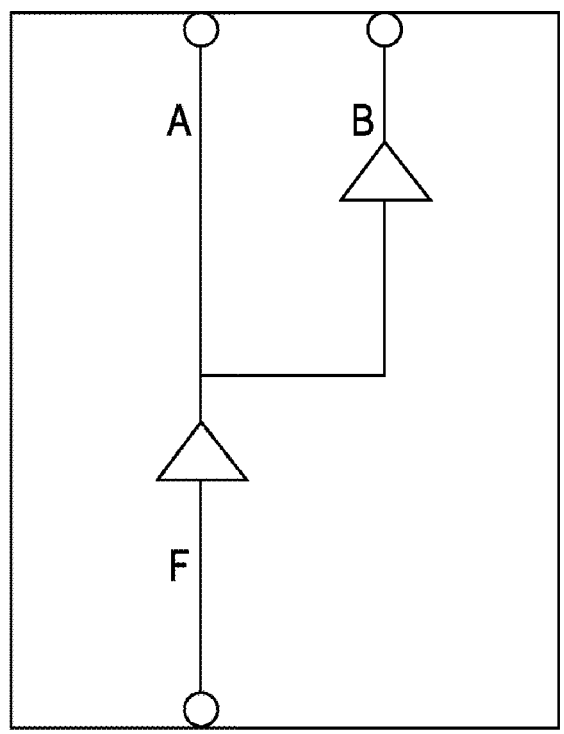
FIG. 13 is a third view illustrating the hierarchical development of the net list according to the present embodiment.

With such processing, hierarchically developed data as shown in FIG. 13 may be obtained.

The hierarchical development according to the present embodiment may accelerate the hierarchical development indispensable for handling the circuit data (including the net list) and may reduce the memory requirement.

As a result, the processing speed of the EDA tool which involves hierarchical development of the circuit data may be accelerated and the memory requirement may be reduced.

Next, the entire operation of the data processor shown in FIG. 3 will be described with reference to FIG. 17.

Figure 17:
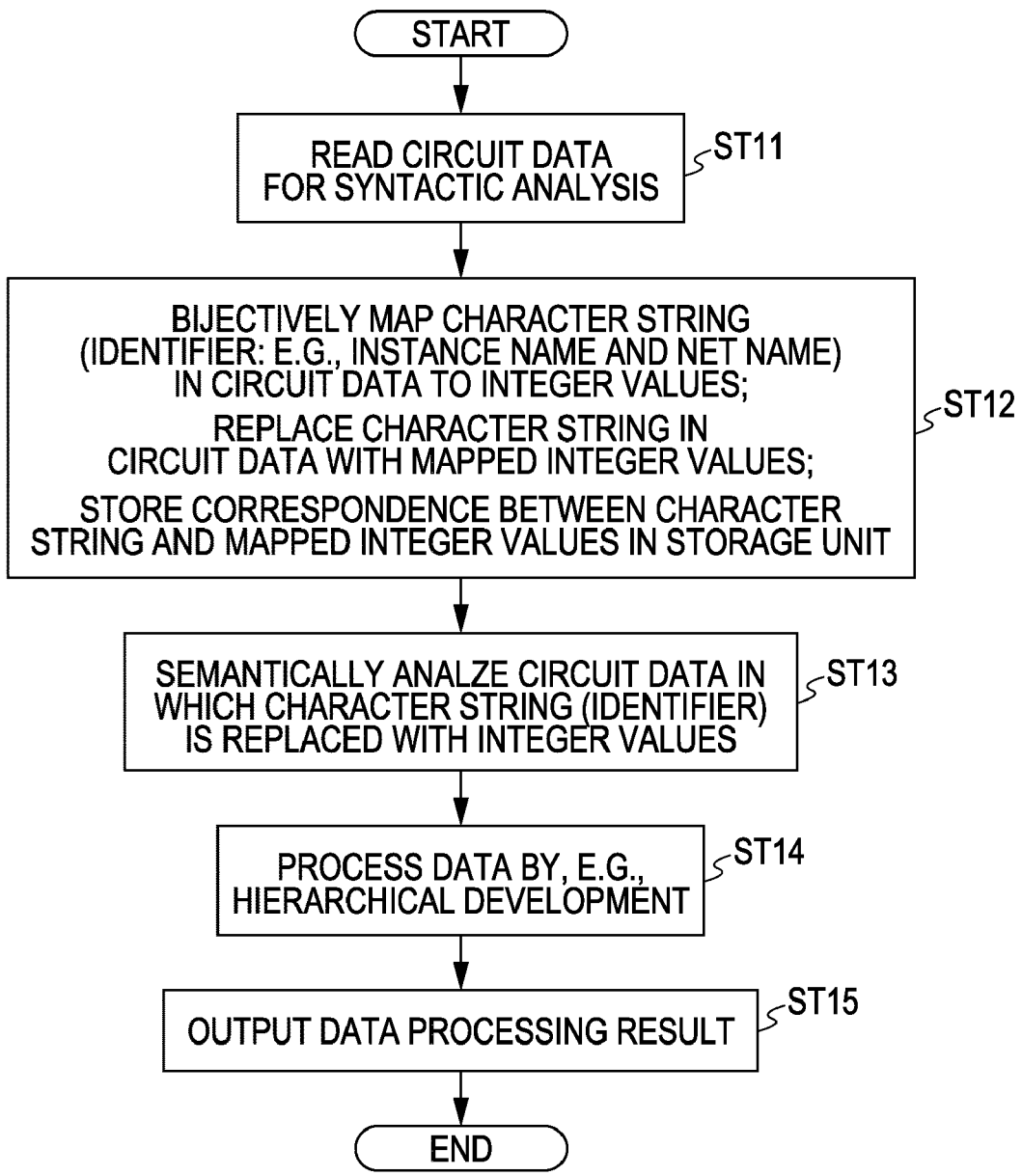
FIG. 17 is a flowchart schematically showing an operation of the data processor of FIG. 3.

FIG. 17 is a flowchart schematically showing an operation of the data processor of FIG. 3.

First, in step ST11, the circuit data is read, syntactic analysis is conducted and each data is stored in the storage section 14.

Next, in step ST12, the replacement section 13 maps the character string in the circuit data stored in the storage section 14 to integer values and replaces the character string with the integer values. Correspondence between the character string and the mapped integer values is recorded in the storage section 14.

Next, in step ST13, the semantic analyzer 15 conducts semantic analysis on the circuit data in which the character string is replaced by the integer values, and stores the processing result in the storage section 14.

Next, data processing, such as hierarchical development described above, is executed on the data stored in the storage section 14 in steps ST12 and ST13.

Then, in step ST15, the result of data processing in step ST14 is output to a console or a file.

As described above, according to the present embodiment, even if an LSI design data increases in size, data processing may be executed after transforming (i.e., mapping) the character string in the circuit data to the integer values.

Since the integer processing is executed at higher speed compared with string processing, increase in processing time may be suppressed.

The hierarchical development according to the present embodiment may accelerate the hierarchical development indispensable for handling the circuit data (including the net list) and may reduce the memory requirement.

As a result, the processing speed of the EDA tool which involves hierarchical development of the circuit data may be accelerated and the memory requirement may be reduced.

Figure 19:
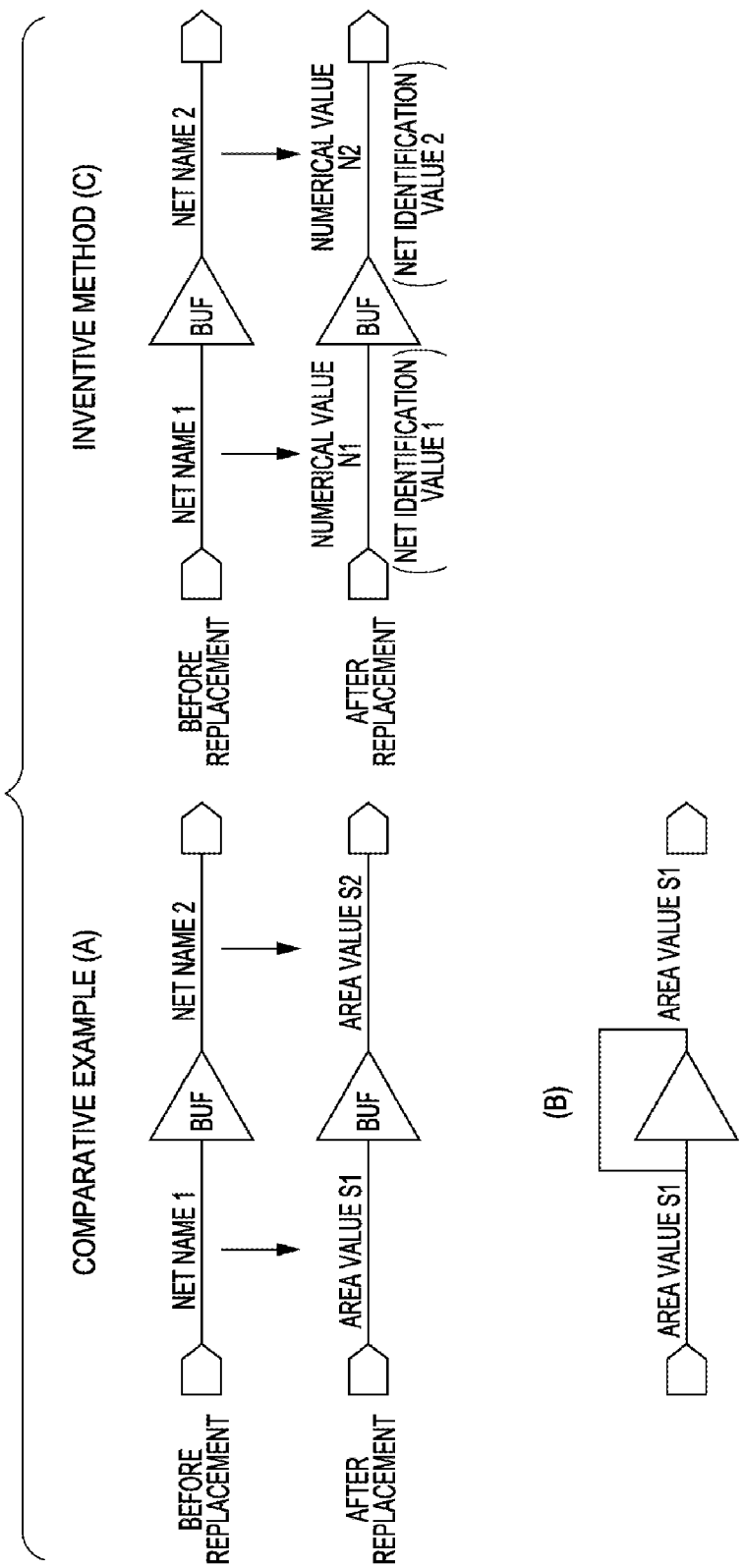
FIGS. 19A, 19B and 19C are first views illustrating effects for mapping a character string to integer values.
Figure 20:
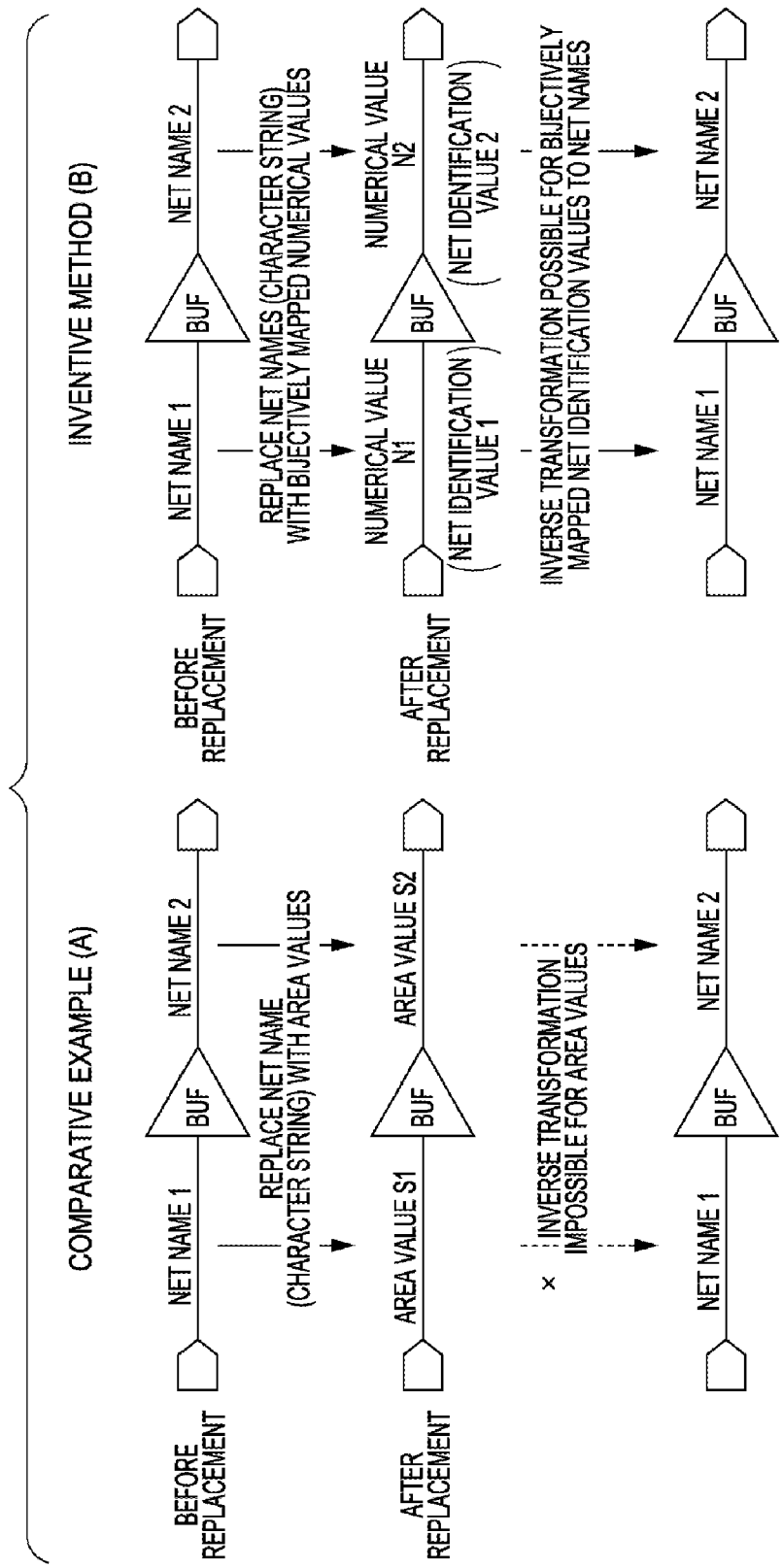
FIGS. 20A and 20B are second views illustrating effects for mapping a character string to integer values.

Hereinafter, the effects of mapping the character string to integer values as in the present embodiment may be described in more detail with reference to FIGS. 18 to 20 as compared with Comparative Example, in which a net surface is transformed to an area value as disclosed in JP-A-2003-167937.

Figure 18:
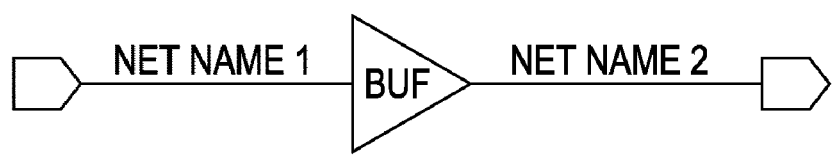
FIG. 18 shows an illustrative net list.

For the illustrative purpose, a Verilog net list, which will be described below, will be represented as shown in FIG. 18.

The net name (i.e., the character string) is replaced by an area value in Comparative Example as shown in FIG. 19A.

In this case, an area value S1 and an area value S2 may possibly become identical with each other.

If the area values are identical with each other, as shown in FIG. 19B, a net connection relationship is varied and the net connection information before replacement may not be kept any more.

Therefore, in Comparative Example, after replacing the net name by the area value, the area value may not again replaced by the original net name.

In the present embodiment (i.e., the invention), on the other hand, as shown in FIG. 19C, the net name (i.e., the character string) is replaced by bijected numerical values.

For the ease of illustration, the numerical values obtained by bijectively mapping the net name (i.e., the character string) are referred to as net identification values.

Since the net identification values are the bijected numerical values, a net identification value N1 and a net identification value N2 are different from each other.

Accordingly, in the present embodiment, a net connection relationship before the replacement may be kept even after the replacement.

In Comparative Example, as shown in FIG. 20A, after replacing the net name by the area value, the area value may not be again transformed to the original net name.

In the present embodiment, on the other hand, as shown in FIG. 20B, after replacing the net name by the net identification value, the net identification value may be again transformed to the original net name.

That is, in the present embodiment, after the net name (i.e., the character string) is bijectively replaced by numerical values, the bijected numerical values may be inversely transformed into the net name.

Note that the foregoing method may be implemented as a program in accordance with the described procedure so as to run on a computer, such as a CPU.

Such a program may be implemented on a recording medium, such as a semiconductor memory, a magnetic disk, an optical disc and a floppy (registered trademark) disc, or a computer in which any of these recording media is placed.

The present application contains subject matter related to that disclosed in Japanese Priority Patent Application JP 2008-197565 filed in the Japan Patent Office on Jul. 31, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A data processor comprising:
   a circuit data providing section which provides circuit data including a character string;
   a replacement section which bijectively maps a character string of the provided circuit data to integer values; and
   a data developer which executes data processing including hierarchical development with respect to the circuit data of the integer values obtained by the replacement section;
   wherein the replacement section divides the character string of a hierarchical net name into a hierarchical name and a net name and processes these names based on a hash function to separately generate a hierarchical class start address and a net class start address; and adds the generated addresses to provide a hash value and processes the hash value based on a hash function to obtain the integer values.

2. A data processor according to claim 1, wherein the replacement section includes a storage section which stores correspondence between the character string and the integer values mapped from the character string in the circuit data.

3. A data processor according to claim 1, wherein:
   the data developer includes a hierarchy developer which creates the circuit data by developing a hierarchy of a net list, the hierarchy of the net list being removed from the circuit data that keeps the hierarchy; and
   the hierarchy developer includes a grouping section which groups nets connected directly together across hierarchical levels, and a net search section which develops a hierarchy of the circuit data.

4. A data processor according to claim 3, wherein the grouping section creates a tree structure for grouping the nets.

5. A data processor according to claim 4, wherein the net search section follows the tree structure.

6. A data processor according to claim 5, wherein, if a plurality of nets exists in a hierarchy level, the net search section determines the most significant net according to a predetermined order.

7. A data processor according to claim 6, wherein the net search section develops the hierarchy of the circuit data by connecting all the circuit device data in a list structure and replacing nets connected to terminals of the device data connected in the list structure by the most significant net.

8. A method for processing data, comprising:
   a first step of providing circuit data including a character string in a providing section of a processor;
   in a replacement section of a processor, a second step of bijectively mapping the character string of the provided circuit data to integer values;
   wherein the second step includes:
      dividing the character string of a hierarchical net name into a hierarchical name and a net name and processing these names based on a hash function to separately generate a hierarchical class start address and a net class start address; and
      adding the generated addresses to provide a hash value and processes the hash value based on the hash function to obtain the integer values; and
   in a data developer of the processor, a third step of processing circuit data of integer values generated in the second step, the processing including developing a hierarchy of a net list.

9. A method for processing data according to claim 8, wherein in the third step, during processing of the circuit data by developing the hierarchy of the net list, the hierarchy being removed from the circuit data that keeps the hierarchy, in a processing section grouping nets connected directly together across hierarchical levels; and in the search section of the processor developing a hierarchy of the circuit data by searching.

10. A non-transitory computer-readable storage medium comprising computer-executable instructions that, when executed by a computer, cause the computer to perform a method of data processing the process comprising:
   a first step of providing circuit data including a character string in a providing section;
   in a replacement section, a second step of bijectively mapping the character string of the provided circuit data to integer values;
   wherein the second step includes:
      dividing the character string of a hierarchical net name into a hierarchical name and a net name and processing these names based on a hash function to separately generate a hierarchical class start address and a net class start address; and
      adding the generated addresses to provide a hash value and processes the hash value based on the hash function to obtain the integer values; and
   in a data developer, a third step of processing circuit data of integer values generated in the second step, the processing including developing a hierarchy of a net list.

* * * * *